United States Patent
Torrisi et al.

(10) Patent No.: US 11,211,783 B2
(45) Date of Patent: Dec. 28, 2021

(54) CIRCUIT WITH CRITICAL OPERATING CONDITION WARNING, CORRESPONDING DEVICE AND METHOD

(71) Applicant: STMicroelectronics S.r.l., Agrate Brianza (IT)

(72) Inventors: Giovanni Luca Torrisi, Aci Catena (IT); Salvatore Abbisso, Augusta (IT); Cristiano Meroni, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 85 days.

(21) Appl. No.: 16/587,346

(22) Filed: Sep. 30, 2019

(65) Prior Publication Data

US 2020/0112164 A1   Apr. 9, 2020

(30) Foreign Application Priority Data

Oct. 9, 2018  (IT) .......................... 102018000009272

(51) Int. Cl.
*H02H 5/04* (2006.01)
*G08B 21/18* (2006.01)
*H02H 1/00* (2006.01)
*H03K 19/003* (2006.01)

(52) U.S. Cl.
CPC ........... *H02H 5/041* (2013.01); *G08B 21/185* (2013.01); *H02H 1/0092* (2013.01); *H03K 19/003* (2013.01)

(58) Field of Classification Search
CPC .... H02H 5/041; H02H 1/0092; H02H 7/0852; G08B 21/185; H03K 19/003; H01F 2027/406

USPC ........................................................ 361/93.8
See application file for complete search history.

(56) References Cited

U.S. PATENT DOCUMENTS

| 5,648,759 A | * | 7/1997 | Miller ..................... B60T 8/404 340/660 |
| 9,779,608 B2 | | 10/2017 | Minoya |
| 2015/0085540 A1 | | 3/2015 | Huang et al. |
| 2015/0130476 A1 | | 5/2015 | Takahashi et al. |

FOREIGN PATENT DOCUMENTS

EP        3101799 A2    12/2016

* cited by examiner

*Primary Examiner* — Thienvu V Tran
*Assistant Examiner* — Sreeya Sreevatsa
(74) *Attorney, Agent, or Firm* — Slater Matsil, LLP

(57) ABSTRACT

A circuit includes processing circuitry is sensitive to a regulated voltage at the output node and to a temperature of the circuit. The processing circuit is configured to provide voltage and temperature sensing signals indicative of the regulated voltage at the output node and the temperature of the circuit. The processing circuitry is configured to assume i) a first state, as a result of the voltage sensing signal reaching a voltage threshold, ii) a second state, as a result of the temperature detection signal reaching a temperature threshold, or iii) a third state, as a result of both the voltage and the temperature sensing signals failing to reach the thresholds. The circuit comprises a warning output coupled to a warning signal generation network controlled by the processing circuitry.

21 Claims, 4 Drawing Sheets

CIRCUIT WITH CRITICAL OPERATING CONDITION WARNING, CORRESPONDING DEVICE AND METHOD

CROSS-REFERENCE TO RELATED APPLICATIONS

This application claims priority to Italian Patent Application No. 102018000009272, filed on Oct. 9, 2018, which application is hereby incorporated herein by reference.

TECHNICAL FIELD

The description relates to revealing critical operating conditions in electrical circuits.

BACKGROUND

Output over-voltage handling is a desirable feature for voltage regulators in order to protect associated circuits such as a supplied microcontroller (μC) or sensitive loads from permanent damage.

Prompt sensing of an undesired output voltage condition and identification of the root cause of a fault may play a significant role in over-voltage detection.

Complex systems, like System Basis Chips (SBCs) or power management systems may provide extensive diagnostics information through a Serial Peripheral Interface (SPI) bus.

Simpler systems, such as those supplied, for instance, by stand-alone voltage regulators, may not be capable of offering over-voltage detection; additional devices—for instance, stand-alone over-voltage monitoring circuits, such as integrated circuits (ICs)—may thus be used for that purpose.

Standards such as ISO26262 increasingly specify, also for simple topologies, extensive diagnostics of, even potential, failure.

Providing such information at a reduced cost (for instance, by avoiding additional ICs) is thus a goal to pursue.

SUMMARY

Despite the extensive activity in the area, further improved solutions are desirable. One or more embodiments can contribute in providing such an improved solution.

One or more embodiments may relate to a corresponding device.

One or more embodiments may relate to a corresponding method.

One or more embodiments may provide a cost effective solution, possibly capable of discriminating under-voltage (UV) from over-voltage (OV) events.

One or more embodiments may offer the possibility of providing, through an advanced thermal warning pin, over-voltage information "on top" of thermal warning information.

One or more embodiments may provide pattern sequences which can be read by any kind of microcontrollers, including simple and cheap microcontrollers.

In a particular embodiment, a circuit comprises an output node configured to supply a regulated voltage signal to a supplied load. Processing circuitry is sensitive to the regulated voltage at the output node and to a temperature of the circuit. The processing circuit is configured to provide voltage and temperature sensing signals indicative of the regulated voltage at the output node and the temperature of the circuit. The processing circuitry is configured to assume i) a first state, as a result of the voltage sensing signal reaching a voltage threshold, ii) a second state, as a result of the temperature detection signal reaching a temperature threshold, or iii) a third state, as a result of both the voltage and the temperature sensing signals failing to reach the thresholds. The circuit comprises a warning output coupled to a warning signal generation network controlled by the processing circuitry. The warning signal generation network is configured to drive the warning output in a first, a second and a third drive mode as a result of the processing circuitry being in the first, second and third state, respectively.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
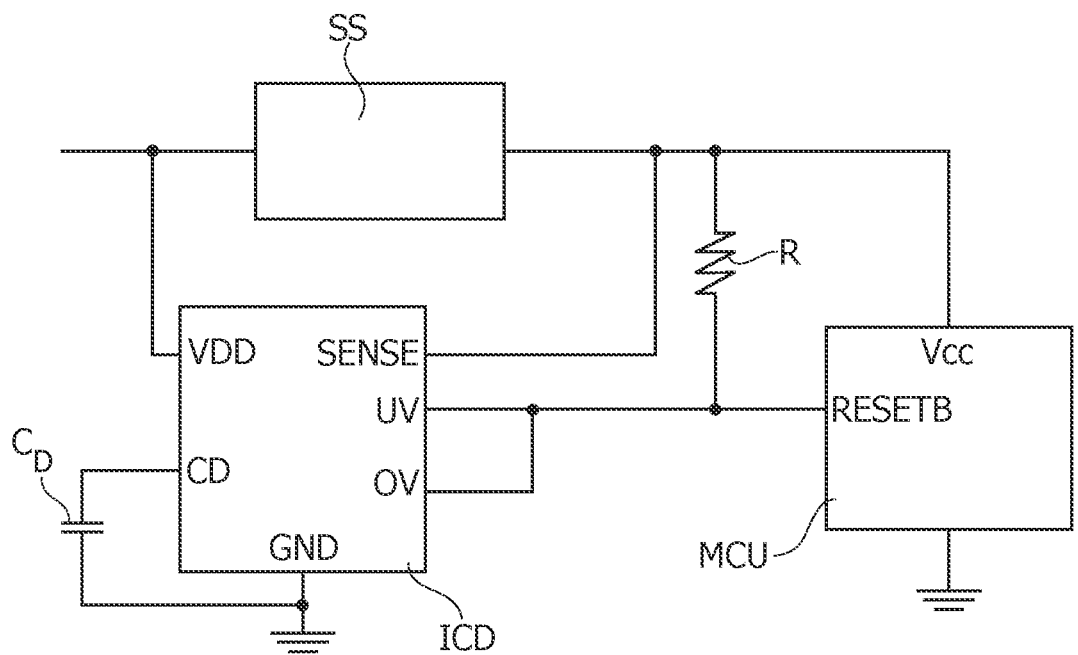
FIG. 1 is a representation of a regulated supply arrangement.

By way of background to the presentation of examples of embodiments, one may refer to FIG. 1. In FIG. 1 a circuit such as, for instance, a microcontroller MCU is shown supplied with a voltage Vcc via a supply source SS such as a DC/DC converter or a low dropout regulator (LDO).

A detector circuit designated ICD—for instance an (additional) integrated circuit or IC—may be provided supplied with the same supply voltage VDD applied to the supply source SS.

A capacitor $C_D$ may facilitate time setting by an internal circuit, for instance, by providing a constant charge and discharge current through a pin CD, with the possibility of time adjustment by setting different capacitance values.

The circuit ICD may be configured to be sensitive to the supply voltage VCC provided by the supply source SS to the microcontroller MCU (at a SENSE input) with the capability of detecting (for instance at respective inputs UV and OV coupled to the output from the source SS) the possible occurrence of under-voltage or over-voltage conditions in the microcontroller MCU. As exemplified in FIG. 1 a pull-up resistor R can be provided in an open drain structure of the UV/OV outputs to facilitate obtaining logic "0" and "1" values.

An arrangement as exemplified in FIG. 1 is otherwise conventional in the art, which makes it unnecessary to provide a more detailed description herein.

An arrangement as presented in FIG. 1—which, as noted, involves an additional IC such as ICD—may be configured in such a way that, when a fault occurs, one or more reset inputs RESETS in the circuit MCU are (always) triggered "low", so that OV events and UV events cannot be distinguished.

One or more embodiments as exemplified herein facilitate providing a solution capable of detecting output over-voltage while at the same time giving a thermal warning indication.

To that effect, one or more embodiments are capable of detecting an over-voltage event and distinguishing between an output under-voltage (UV) event and output over-voltage (OV), and providing, for instance to an external microcontroller, such as MCU itself, a warning or alert signal indicative of the temperature of the IC having reached an (upper) threshold level.

Figure 2:
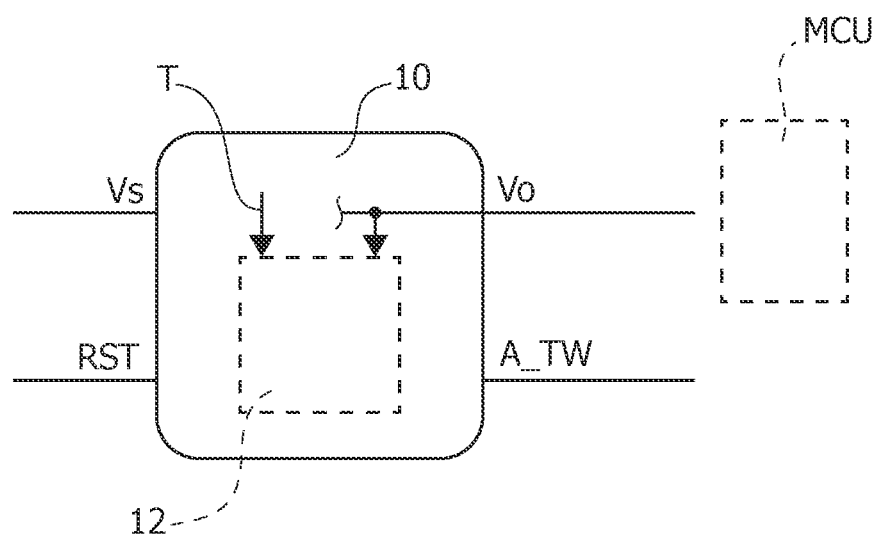
FIG. 2 is a general representation of a supply arrangement according to embodiments.

Also, one or more embodiments facilitate avoiding the use SPI or other protocols, thus facilitating implementation in (very) simple devices such as a voltage regulator as exemplified at 10 in FIG. 2.

In one or more embodiments, the voltage regulator 10 may comprise an input pin Vs configured to receive an input voltage and an output pin Vo configured to provide a regulated supply voltage to an associated circuit supplied thereby such as a supplied microcontroller (MCU, for instance) or a sensitive load.

Such an associated supplied circuit can be a distinct element from the embodiments of the circuit 10 and is shown in dashed line in FIG. 2.

In one or more embodiments the voltage regulator 10 may comprise two pins RST and A_TW configured to distinguish between under-voltage (UV) and over-voltage (OV) events and provide corresponding warning signals to an external microcontroller (such as MCU itself).

For instance, RST may be for UV and A_TW for both OV and thermal warning, that is, an under voltage condition may be indicated through the RST pin and a same pin (that is A_TW) may be exploited both to indicate an output over-voltage (OV) condition and to provide a thermal warning.

It will be appreciated that various methods and circuit arrangements for revealing under-voltage (UV) and over-voltage (OV) events as well as the temperature having reached an (upper) threshold are known to those of skill in the art, which makes it unnecessary to provide a more detailed description herein.

One or more embodiments are primarily concerned with arrangements which facilitate indicating such conditions at the pins of a device such as a voltage regulator 10 irrespective of how these conditions are revealed. Also, one or more embodiments may offer the advantage of being largely "transparent" to the methods/arrangements adopted for revealing under-voltage (UV) and over-voltage (OV) events as well as the temperature having reached an (upper) threshold.

For instance, in one or more embodiments as exemplified herein, a same pin (e.g. A_TW) can be "shared" for providing two different warning signals, with the capability of distinguishing these two events.

For instance, in one more embodiments an over temperature, that is the temperature of the voltage regulator 10 having reached an (upper) threshold, may result in the A_TW pin being set to a certain logic level, for instance LOW. In one more embodiments an over-voltage event in the voltage Vo supplied to the associated circuit, for instance MCU, may generate a continuous burst on the A_TW pin.

Figure 3:
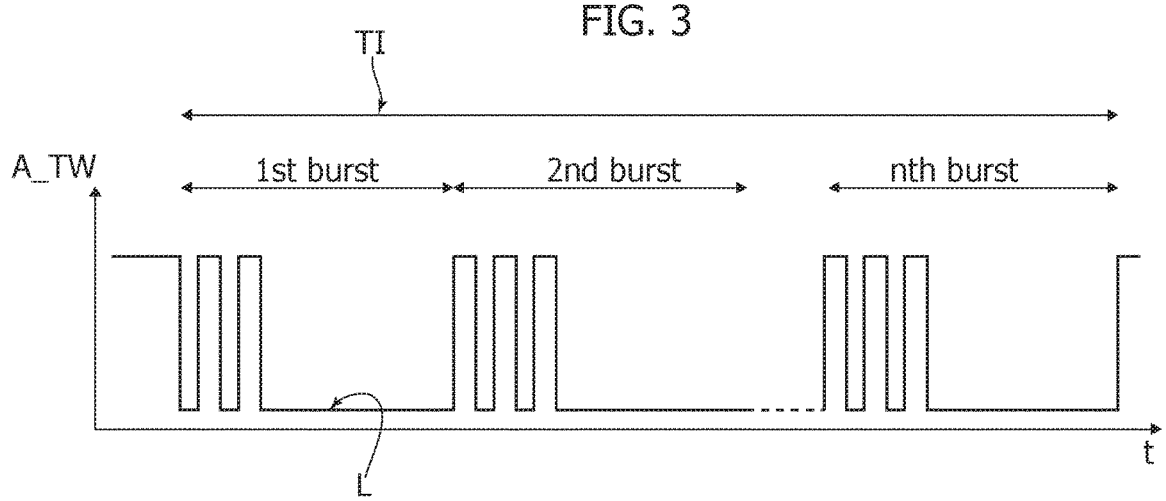
FIGS. 3 and 4 (which includes FIGS. 4A, 4B and 4C) comprise diagrams exemplary of possible time behaviors of certain signals in embodiments.

This possible principle of operation is exemplified in FIG. 3, which is indicative of a time interval TI where an over-voltage OV condition occurs with the signal at the pin A_TW (ordinate scale) exhibiting over time (abscissa scale t) a behavior including a sequence of bursts (1st burst, 2nd burst, . . . , nth burst) superposed to a low logic level L. An over-temperature condition possibly occurring during TI may have no effect on the sequence of the burst signal.

Figure 4:
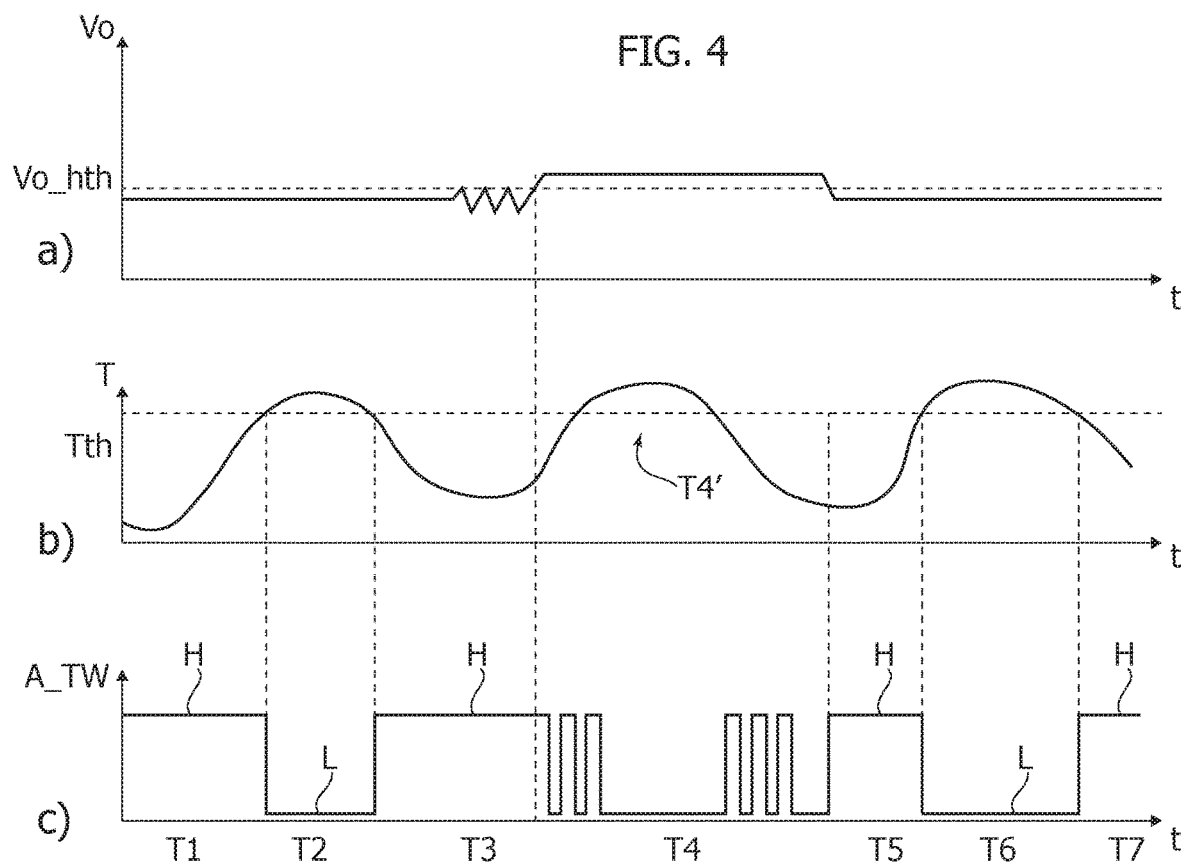

As exemplified in the time diagrams of FIG. 4, such possible principle of operation may facilitate taking into account the fact the over-voltage event may be regarded as having a priority in respect of an over-temperature event.

In an arrangement as exemplified herein, if both over-voltage (OV) and over temperature events occur, OV will have a (first) priority on the A_TW pin, so that an over temperature event will not be detectable via the A_TW pin before the OV event disappears.

FIGS. 4A-4C exemplify, by referring to a common time (abscissa) scale t, possible time behaviors of:

the output voltage Vo supplied to the associated circuit MCU, sensed (in any manner known to those of skill in the art) in respect of possible over-voltage events: for instance, an upper threshold Vo_hth reached) of FIG. 4A;

the temperature T sensed (again, in any manner known to those of skill in the art) in respect of possible over-temperature events: for instance, an upper threshold Tth of, for instance, 150° C. reached) of FIG. 4B;

the signal at the pin A_TW of the voltage regulator—portion c) of FIG. 4C.

The exemplary diagrams of FIG. 4 may thus be regarded as comprising subsequent intervals T1 to T7 where the following conditions apply:

interval T1: no over-voltage, no over temperature—signal at A_TW high (H, steady, no bursts);

interval T2: no over-voltage, but over temperature threshold reached and exceeded —signal at A_TW low (L, steady, no bursts);

interval T3: over-voltage threshold close to being reached, no over-temperature —signal at A_TW low (L, steady, no bursts);

interval T4: over-voltage threshold reached and exceeded over the whole interval, with over temperature threshold (also) reached and exceeded over an intermediate portion T4' of the interval T4—signal bursts at A_TW: in an arrangement as exemplified herein, the transition from high to low on the A_TW pin is not related to the over-temperature event but is merely exemplary of the sequence of the burst signal (for instance, as shown in FIG. 3); as noted, in an arrangement as exemplified herein, the over-temperature event is "secondary" with respect to the over-voltage event;

interval T5: no (longer) over-voltage, no over temperature—signal at A_TW returns high (H, steady, no bursts);

interval T6: no over-voltage, but over temperature threshold reached and exceeded —signal at A_TW low (L, steady, no bursts no over-voltage, interval T7: no over-voltage, no over temperature_signal at A_TW high (H, steady, no bursts).

It will be otherwise appreciated that, while a burst-like signal (1st burst, 2nd burst, . . . , nth burst) has been exemplified herein, in one or more embodiments the first drive mode of the warning output pin A_TW adopted to indicate the first state (over-voltage) of the circuit 10 may include a different type of pulsed, and, more generally, alternating signal may be adopted in one or more embodiments.

It will be also appreciated that, in one or more embodiments, the logic levels high (H) and low (L) can be possibly exchanged with each other.

It is otherwise noted that devoting the RST pin to a function different from reset information may not be advisable, for instance because the RST pin in a voltage regulator may be (directly) connected to the RST pin of a microcontroller configured to accept a specific signal on its input.

In one or more embodiments, the exemplary procedure discussed above for over-temperature and over-voltage management can be implemented as a state machine (FSM) 12 in the voltage regulator 10.

Figure 5:
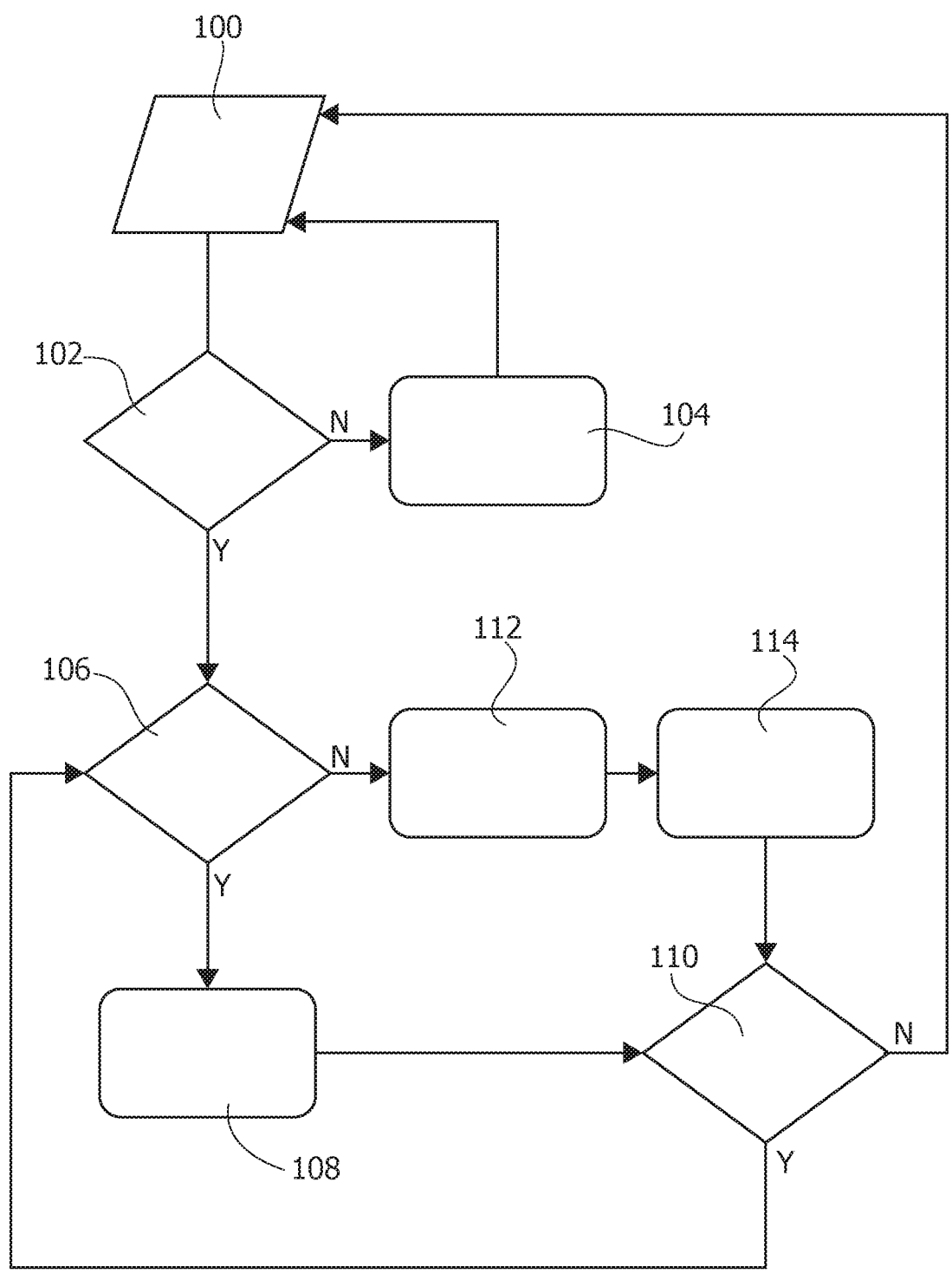
FIG. 5 is a flow chart exemplary of possible operation of embodiments.

In one or more embodiments, the state machine 12 may be configured (in a manner known per se to those of skill in the art) to be sensitive to the voltage Vo and the temperature T and to operate according to the flow chart of FIG. 5.

With the voltage regulator active (act 100), a possible over-voltage and/or over-temperature event is checked (act 102) on the basis of the signals for Vo and T.

If no over-voltage and/or over-temperature event is revealed (act 102=>N), in an act 104 the A_TW pin is set/maintained to, e.g. high (H) and operation is looped back for a continuous check (act 102).

In case an over-voltage and/or over-temperature event revealed (act 102=>Y), an act 106 is performed in order to distinguish between an over-voltage and/or and over-temperature event.

In case of over-voltage revealed (act 106=>Y), a (periodic) burst signal is made available on the A_TW output pin (act 108). This may occur, for instance, as long as the over-voltage event persists: this latter condition may be checked in an act no, which, in the case of positive outcome (act 110=>Y), may cause the machine to loop back to act 106.

In case no over-voltage condition is revealed (act 106=>N), the positive outcome of act 102 is construed as indicative of an over temperature condition (act 112) and in an act 114 the A_TW pin is set, e.g., to low (L) after which the machine evolves to act no.

As discussed previously, the act no may involve a check as to whether an over-voltage/over temperature condition persists. As noted, a positive outcome (act 110=>Y)) may cause the machine to loop back to act 106.

Conversely, a negative outcome (act 110=>N) results in the machine looping back to act 100. This essentially amounts to letting the machine 12 re-start from the active mode as a result of the causes of warning no longer persisting (for instance as a result of being solved).

In one or more embodiments, burst signal patterns as exemplified in FIGS. 3 and 4 can be generated, in a manner known per se, for instance via a burst generator (14 in FIG. 7) comprising a Schmitt trigger circuit coupled to a voltage V3V3 for charging and discharging an input capacitor, with, e.g. a D latch to achieve frequency division of the pulsed signal obtained thereby, for instance by using a delay may to obtain bursts of e.g. 3520 µS, 7040 µS from a 220 µS pulse width. For instance a delay may be used to generate three bursts and using a RC filter to reduce the small spike due to the delay.

Figure 6A:
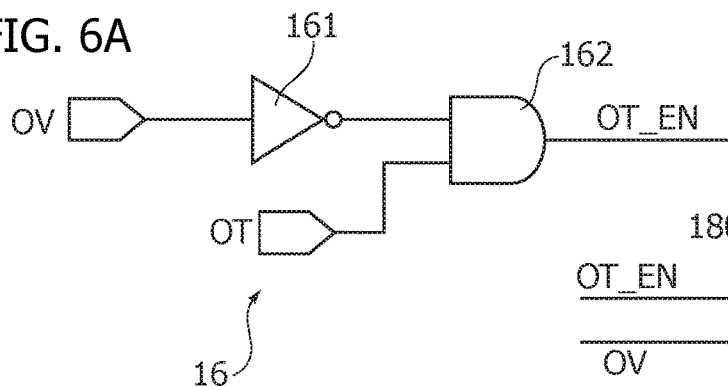
FIGS. 6A, 6B and 7 comprise circuit diagrams exemplary of possible details of embodiments.
Figure 6B:
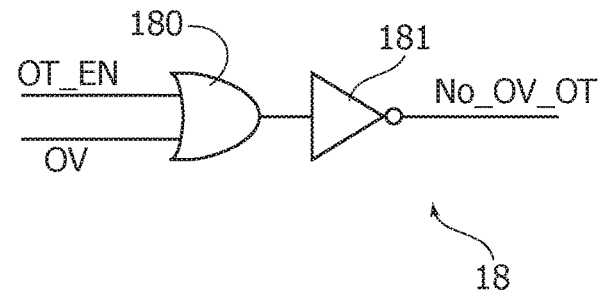
Figure 7:
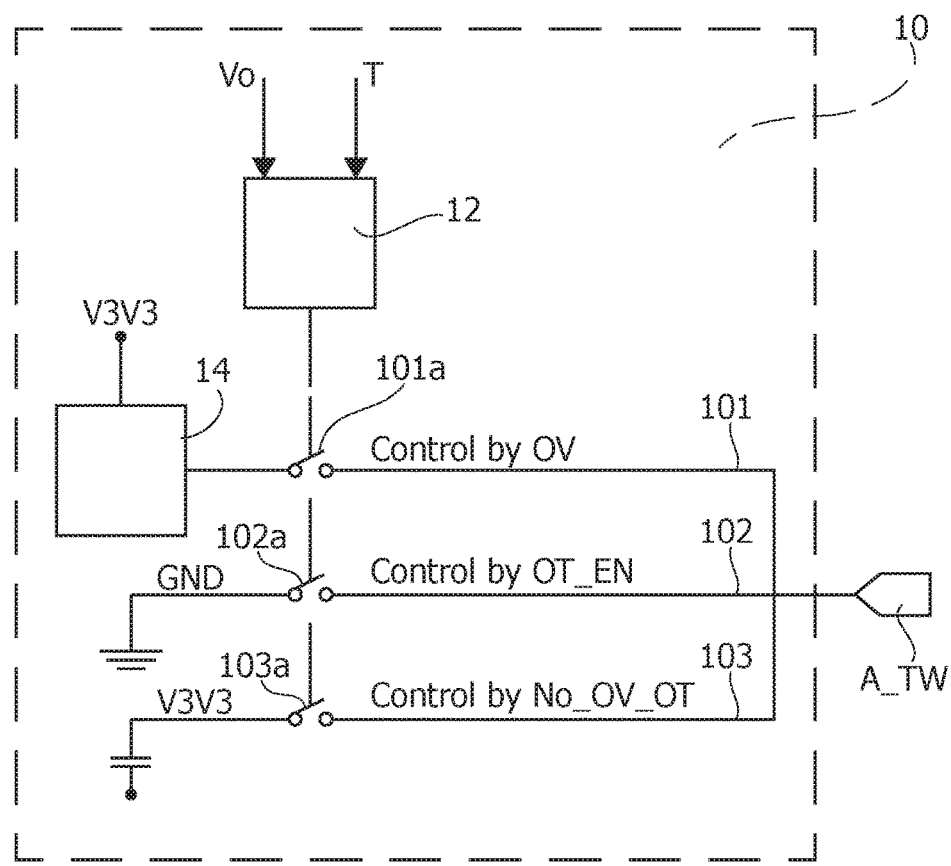

In the case of concurrent over-voltage and over temperature (see e.g. interval T4' in FIG. 4B) priority of over-voltage indication in respect of over-temperature can be achieved via circuits as exemplified in FIGS. 6A, 6B and 7, which are suited to be incorporated to the state machine 12 and/or to be associated therewith.

For instance, FIG. 6A is representative of an exemplary circuit 16 comprising inputs configured to receive signals OV and OT indicative (for instance, when "high") of an over-voltage condition and an over-temperature condition revealed, respectively. These signals are fed (after logical inversion at an inverter 161 gate, for the signal OV) to the inputs of an AND gate 162 which produces an output signal OT_EN indicative (when "high") of over-temperature (only) occurring: in fact the output OT_EN from the AND gate 162 will be "high" as a result of OT being "high" (over-temperature revealed) and OV being "low" (no over-voltage revealed).

As exemplified in FIG. 6B the signal OT_EN may be applied to one of the inputs of an OR gate 180 receiving the signal OV on the other input, with the output from the OR gate 180 providing (after logical inversion at an inverter 181) an output signal No_OV_OT indicative of neither over-voltage nor over-temperature revealed. In fact the output No_OV_OT from the inverter 181 will be "high" as a result of the output from the OR gate 180 being "low", that is with both of OV and OT "low" (no over-voltage and no over temperature revealed).

FIG. 7 is exemplary of a possible implementation of the A_TW pin as a wired-OR connection of three signal paths 101, 102, 103, namely:

a first path 101 which can be activated (that is made conductive, for instance via a switch 101a, such as an electronic switch provided by a transistor such as a MOSFET transistor) to couple the A_TW pin to the burst generator 14 under the control of the signal OV (indicative of over-voltage revealed);

a second path 102 which can be activated (that is made conductive, for instance via a switch 1022a, such as an electronic switch provided by a transistor such as a MOSFET transistor) to couple the A_TW pin to a "low" level L (for instance ground GND) under the control of the signal OT_EN (indicative of over-temperature—only—revealed); and a third path 103 which can be activated (that is made conductive, for instance via a switch 103a, such as an electronic switch provided by a transistor such as a MOSFET transistor) to couple the A_TW pin to a "high" level H (for instance, a voltage $V_3V_3$ (this may be an internal power supply configured to supply the burst function circuit as use to drive the burst generator 14) under the control of the signal No_OV_OT (indicative of no over-voltage and no over-temperature revealed).

In an arrangement as exemplified herein, a burst signal always on, but without OV signal, will not provide any indication to the A_TW pin through the associated switch. Also, the signals OV, OT_EN and No_OV_OT will not at logic level "1" at a same time. If OV="1", only a burst signal will be sent out via the associated switch towards A_TW. If OT_EN="1", only a logic "o" signal will be send to A_TW. If No_OV_OT="1", only a logic "1" signal will be send to A_TW.

In one or more embodiments, a circuit (e.g., 10) may comprise:

an output node (e.g., Vo) configured to supply a regulated voltage signal to a supplied load (e.g., MCU), processing circuitry (e.g. a state machine, 12) sensitive to the regulated voltage at the output node and to a temperature (e.g., T) of the circuit, the processing circuit configured to provide voltage (e.g., OV) and temperature (e.g., OT) sensing signals indicative of the regulated voltage at the output node and the temperature of the circuit, wherein the processing circuitry is configured (e.g. 16, 18 or the acts 100 to 110 in FIG. 5) to assume:

i) a first state (e.g., 102, 106, 108), as a result of the voltage sensing signal reaching a voltage threshold (e.g., Vo_hth), ii) a second state (e.g., 102, 106, 112, 114), as a result of the temperature detection signal reaching a temperature threshold (e.g., Tth), iii) a third state (e.g., 102, 104), as a result of both the voltage and the temperature sensing signals failing to reach the thresholds.

In one or more embodiments, the circuit may comprise a warning output (e.g., A_TW) coupled to a warning signal generation network (e.g., 101, 101a, 14; 102, 102a, GND; 103, 103a, V3V3) controlled by the processing circuitry, the warning signal generation network configured to drive (e.g., 101a, 102a, 103a) the warning output in a first, a second and a third drive mode as a result of the processing circuitry being in the first, second and third state, respectively.

In one or more embodiments, the processing circuitry may be configured to assume:

the first state as a result of the voltage sensing signal reaching the voltage threshold irrespective of whether the temperature sensing signal reaches the temperature threshold, and/or the second state (only) as a result of the temperature sensing signal reaching the temperature threshold with the voltage sensing signal failing to reach the voltage threshold.

In one or more embodiments, the warning signal generation network may be configured to drive the warning output in driving modes selected out of:

an alternating signal (e.g., 1st burst, 2nd burst, . . . , nth burst; 14) applied to the warning output;

a first logic value (e.g., L, GND) applied to the warning output;

a second logic value (e.g. H, V3V3) applied to the warning output.

In one or more embodiments, the alternating signal may comprise a pulsed, optionally burst-like, signal.

One or more embodiments may comprise an alternating signal generator (e.g., Schmitt trigger-based as 14) supplied with a supply voltage (e.g., V3V3), and wherein the warning signal generation network may be configured to apply to the warning output the alternating signal, the first logic value and the second logic value by coupling (e.g. via the switches 101a, 102a, 103a) the warning output to the alternating signal generator, to ground and to the supply voltage.

In one or more embodiments, the first, second and third mode may comprise the alternating signal (e.g., 1st burst, 2nd burst, . . . , nth burst; 14), the first logic value (e.g., L; GND) and the second logic value (e.g., H; V3V3) applied to the warning output (e.g., A_TW), respectively.

In one or more embodiments, the processing circuitry may be configured to assume the first state as a result of the voltage sensing signal reaching an upper voltage threshold (e.g., Vo_hth).

In one or more embodiments, the circuit may comprise a further warning output (e.g., RST) coupled to the processing circuitry, the further warning output configured to receive a further warning signal indicative of the voltage sensing signal reaching a further threshold, optionally a lower threshold (e.g., with RST to indicate only a UV function, with the OV and OT functions indicated from A_TW).

In one or more embodiments, a device (such as voltage regulated supply arrangement for a load, such as a microcontroller MCU), may comprise:

a circuit according to one or more embodiments, a supplied load (e.g., MCU) coupled to the output node of the circuit to receive therefrom the regulated voltage signal, and a processor circuit (e.g., MCU) coupled to the warning output of the circuit, the processor circuit sensitive to warning signals provided by the warning output of the circuit driven in the first, second and third drive modes.

In one or more embodiments, a method may comprise:

supplying to a supplied load a regulated voltage signal from a regulator circuit, sensing the regulated voltage supplied to the supplied load as well as a temperature of the regulator circuit and providing voltage and temperature sensing signals indicative of the regulated voltage and the temperature of the regulator circuit, providing a state machine sensitive to the voltage and temperature sensing signals, transitioning the state machine to:

i) a first state, as a result of the voltage sensing signal reaching a voltage threshold, ii) a second state, as a result of the temperature detection signal reaching a temperature threshold, iii) a third state, as a result of both the voltage and the temperature sensing signals failing to reach the thresholds, generating an output warning signal with a first, a second and a third output drive mode as a result of the state machine (12) being in the first, second and third state, respectively.

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:

an output node configured to supply a regulated voltage signal to a supplied load;

processing circuitry sensitive to the regulated voltage signal at the output node and to a temperature of the circuit, the processing circuit configured to provide a voltage sensing signal indicative of the regulated voltage signal at the output node and a temperature sensing signal indicative of the temperature of the circuit, wherein the processing circuitry is configured to assume:

a first state corresponding to the voltage sensing signal reaching a voltage threshold, a second state corresponding to the temperature sensing signal reaching a temperature threshold, and a third state corresponding to the voltage sensing signal failing to reach the voltage threshold and the temperature sensing signal failing to reach the temperature threshold;

a warning output configured to be driven in a corresponding driving mode based on a driving signal applied to the warning output, the driving signal comprising an alternating signal, a first logic value, and a second logic value for the driving modes; and a warning signal generation network controlled by the processing circuitry and configured to drive the warning output in a first drive mode as a result of the processing circuitry being in the first state, in a second drive mode as a result of the processing circuitry being in the second state, and in a third drive mode as a result of the processing circuitry being in the third state.

2. The circuit of claim 1, wherein the processing circuitry is configured to assume the first state when the voltage sensing signal reaches the voltage threshold irrespective of whether the temperature sensing signal reaches the temperature threshold.

3. The circuit of claim 1, wherein the processing circuitry is configured to assume the second state when the temperature sensing signal reaches the temperature threshold and the voltage sensing signal fails to reach the voltage threshold.

4. The circuit of claim 1, wherein the processing circuitry is configured to assume the first state when the voltage sensing signal reaches the voltage threshold irrespective of whether the temperature sensing signal reaches the temperature threshold and to assume the second state when the temperature sensing signal reaches the temperature threshold and the voltage sensing signal fails to reach the voltage threshold.

5. The circuit of claim 1, wherein the warning signal generation network is configured to apply one of the alternating signal, the first logic value, or the second logic value to drive the warning output in the corresponding driving mode.

6. The circuit of claim 5, further comprising an alternating signal generator supplied with a supply voltage, wherein the warning signal generation network is configured to apply the alternating signal to the warning output by coupling the warning output to the alternating signal generator, to apply the first logic value to the warning output by coupling the warning output to ground and to apply the second logic value to the warning output by coupling the warning output to the supply voltage.

7. The circuit of claim 1, wherein the alternating signal comprises a pulsed signal.

8. The circuit of claim 1, wherein the alternating signal comprises a burst-like signal.

9. The circuit of claim 1, wherein the first drive mode comprises the alternating signal, the second drive mode comprises the first logic value, and the third drive mode comprises the second logic value.

10. The circuit of claim 1, wherein the processing circuitry is configured to assume the first state as a result of the voltage sensing signal reaching an upper voltage threshold.

11. The circuit of claim 1, wherein the circuit comprises a further warning output coupled to the processing circuitry, the further warning output configured to receive a further warning signal indicative of the voltage sensing signal reaching a further voltage threshold.

12. The circuit of claim ii, wherein the further voltage threshold is lower than the voltage threshold.

13. A device, comprising:
an output node;
processing circuitry sensitive to a regulated voltage signal at the output node and to a temperature of the device, the processing circuit configured to provide a voltage sensing signal indicative of the regulated voltage signal at the output node and a temperature sensing signal indicative of the temperature of the device, wherein the processing circuitry is configured to assume:

a first state corresponding to the voltage sensing signal reaching a voltage threshold, a second state corresponding to the temperature sensing signal reaching a temperature threshold, and a third state corresponding to both the voltage sensing signal failing to reach the voltage threshold and the temperature sensing signal failing to reach the temperature threshold;

a warning output configured to be driven in a corresponding driving mode based on a driving signal applied to the warning output, the driving signal comprising an alternating signal, a first logic value, and a second logic value for the driving modes;

a warning signal generation network controlled by the processing circuitry and configured to drive the warning output in a first drive mode as a result of the processing circuitry being in the first state, in a second drive mode as a result of the processing circuitry being in the second state, and in a third drive mode as a result of the processing circuitry being in the third state;

a supplied load coupled to the output node of the regulated voltage signal; and a processor circuit coupled to the warning output, the processor circuit sensitive to warning signals provided by the warning output driven in the first, second and third drive modes.

14. The device of claim 13, wherein the processing circuitry is configured to assume the first state when the voltage sensing signal reaches the voltage threshold irrespective of whether the temperature sensing signal reaches the temperature threshold and to assume the second state when the temperature sensing signal reaches the temperature threshold and the voltage sensing signal fails to reach the voltage threshold.

15. The device of claim 13, wherein the warning signal generation network is configured to apply one of the alternating signal, the first logic value, or the second logic value to drive the warning output in the corresponding driving mode.

16. A method, comprising:
supplying a regulated voltage signal from a regulator circuit to a supplied load;
sensing the regulated voltage signal supplied to the supplied load;
sensing a temperature of the regulator circuit;
generating a voltage sensing signal indicative of the regulated voltage signal;
generating a temperature sensing signal indicative of the temperature of the regulator circuit; and
generating an output warning signal that is driven in a first mode when the voltage sensing signal reaches a voltage threshold, in a second mode when the temperature sensing signal reaches a temperature threshold and a third mode when the voltage sensing signal fails to reach the voltage threshold and the temperature sensing signal fails to reach the temperature threshold, the output warning signal comprising one of an alternating signal, a first logic value, and a second logic value for the driving modes.

17. The method of claim 16, wherein the output warning signal is driven in the first mode when the voltage sensing signal reaches the voltage threshold irrespective of whether the temperature sensing signal reaches the temperature threshold and wherein the output warning signal is driven in the second mode when the temperature sensing signal reaches the temperature threshold and the voltage sensing signal fails to reach the voltage threshold.

18. The method of claim 16, wherein the first mode is different than the second mode, the second mode is different than the third mode and the third mode is different than the first mode, and wherein each of the first mode, the second mode, and the third mode comprises a mode selected from the group consisting of the alternating signal, the first logic value, and the second logic value.

19. The method of claim 16, wherein the first mode comprises the alternating signal, the second mode comprises the first logic value, and the third mode comprises the second logic value.

20. The method of claim 16, wherein the alternating signal comprises a burst-like pulsed signal.

21. The method of claim 16, further comprising generating a further warning signal indicative of the voltage sensing signal reaching a further voltage threshold that is lower than the voltage threshold.

\* \* \* \* \*

UNITED STATES PATENT AND TRADEMARK OFFICE
CERTIFICATE OF CORRECTION

PATENT NO. : 11,211,783 B2
APPLICATION NO. : 16/587346
DATED : December 28, 2021
INVENTOR(S) : Giovanni Luca Torrisi Page 1 of 1

It is certified that error appears in the above-identified patent and that said Letters Patent is hereby corrected as shown below:

In the Claims

Claim 12, Column 11, Line 57; delete "ii" and insert --11--.

Claim 16, Column 10, Line 57; delete "one of".

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*